(12) United States Patent
Lin

(10) Patent No.: US 12,387,666 B2
(45) Date of Patent: Aug. 12, 2025

(54) SCAN DRIVE CIRCUIT

(71) Applicant: AUO Corporation, Hsin-Chu (TW)

(72) Inventor: Cheng-Hsing Lin, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 18/796,366

(22) Filed: Aug. 7, 2024

(65) Prior Publication Data

US 2025/0095557 A1    Mar. 20, 2025

(30) Foreign Application Priority Data

Sep. 20, 2023    (TW) ................................ 112135932

(51) Int. Cl.
| G09G 3/3266 | (2016.01) |
| G09G 3/32 | (2016.01) |
| H03K 17/687 | (2006.01) |

(52) U.S. Cl.
CPC ............ G09G 3/32 (2013.01); G09G 3/3266 (2013.01); H03K 17/6871 (2013.01); G09G 2310/0267 (2013.01); G09G 2310/08 (2013.01); G09G 2330/026 (2013.01)

(58) Field of Classification Search
CPC ............ G09G 3/32; G09G 2310/0267; G09G 2310/08; G09G 2330/026; H03K 17/6871
See application file for complete search history.

(56) References Cited

U.S. PATENT DOCUMENTS

| 9,030,399 B2 * | 5/2015 | Tseng | G09G 3/20 |
| | | | 345/100 |
| 2013/0100007 A1 * | 4/2013 | Yamamoto | G09G 3/36 |
| | | | 377/64 |

FOREIGN PATENT DOCUMENTS

| TW | 201539418 A | 10/2015 | |
| TW | I819818 B | 10/2023 | |
| WO | WO-2019080572 A1 * | 5/2019 | ............... G09G 3/36 |

OTHER PUBLICATIONS

Office Action issued by Taiwan Intellectual Property Office on Aug. 8, 2024.

* cited by examiner

*Primary Examiner* — Stephen G Sherman
(74) *Attorney, Agent, or Firm* — WPAT, PC

(57) ABSTRACT

A scanning drive circuit includes: a start-up circuit, activated based on a start-up signal or a previous stage output signal to pre-charge a first internal node; a logic gate operating based on the start-up signal or the previous stage output signal and a first output signal to control a second voltage at a second internal node; a pull-down circuit determining whether to pull down a first voltage of the first internal node based on the second voltage of the second internal node; and a plurality of output circuits pre-charging a third internal node based on the first voltage of the first internal node and generating a plurality of output signals based on a scanning clock signal or a plurality of clock signals, and further determining whether to pull down the output signals based on the second voltage of the second internal node.

6 Claims, 5 Drawing Sheets

SCAN DRIVE CIRCUIT

This application claims the benefit of Taiwan Patent application Serial No. 112135932, filed Sep. 20, 2023, the disclosure of which is incorporated by reference herein in its entirety.

TECHNICAL FIELD

The disclosure relates in general to a scan drive circuit.

BACKGROUND

The imaging display device currently features a new display technology: Micro LED (µLED) which is an emerging display technology that uses microscopic light-emitting diodes (LEDs) as pixels to produce images. Due to its small size and high efficiency, µLED is considered the next-generation display technology with the potential to replace traditional liquid crystal displays (LCDs) and organic light-emitting diode (OLED) displays.

In µLED display devices, multiple sets of scan gate signals are required to ensure normal operation of pixel circuits. Scan gate signals are used to control the pixel circuits within the display device. In display technology, scan gate signals are typically used to select or drive rows or columns of pixels.

Currently, µLED display technology faces some design challenges. One such challenge is the splicing requirement: µLED technology may need to splice multiple micro LEDs together to form a complete display panel, which can bring additional challenges to circuit design and layout. Within the active area of a µLED display, the space for the scan circuits driving the pixels is limited. To address this spatial limitation, one possible solution is to merge multiple sets of scan driver circuits into a multi-phase scan driver circuit. This method can more efficiently utilize the limited space. Additionally, by combining scan driver circuits, the required circuit layout space can be reduced, making the overall circuit design more streamlined. This approach can also decrease the number of pins needed and the number of signals required, thereby simplifying signal processing and reducing overall signal complexity.

Furthermore, in circuit design, issues related to bidirectional scan circuits can arise. Bidirectional scan circuits allow scanning in two directions. To make the circuit design simpler and more efficient, it might be considered to remove unnecessary parts or functions, such as eliminating related bidirectional scan circuits when bidirectional scanning is not required. However, when attempting to remove the bidirectional scan circuits, certain functions of the circuit (such as circuit pullback functions) may be affected, causing the circuit to malfunction.

Additionally, a common issue in circuit design is the impact of signal transmission methods and layout on space. Regarding limitations in circuit transmission methods, the way signals are transmitted from one part of the circuit to another may be restricted. For example, in multi-stage transmission, when a signal needs to traverse multiple or several circuit stages, this can increase circuit complexity. Each stage of transmission might require additional components and connections, which can enlarge the circuit size and complexity. Moreover, due to the transmission method and multi-stage transmission needs, the circuit layout might require more space to accommodate all components and connections. This could result in a larger circuit board or the need for more layers to house all connections.

Another issue in circuit design pertains to signal width and clock problems. If the signal width of the clock signal used in the imaging display device is limited, it may affect the circuit's performance or functionality, especially in applications requiring higher frame rates. To address these limitations and issues, more clocks and more stages of clocks may be needed. However, this could lead to a significant increase in the number of pins, subsequently increasing circuit complexity and cost.

SUMMARY

According to one embodiment, a scan driving circuit is provided. The scan driving circuit comprises: a startup circuit configured to perform startup control based on a startup signal or a preceding stage output signal to precharge a first internal node; a logic gate coupled to the startup circuit, configured to perform logic control based on the startup signal or the preceding stage output signal and a first output signal to control a second potential of a second internal node; a pull-down circuit coupled to the startup circuit, configured to determine whether to pull down a first potential of the first internal node based on the second potential of the second internal node; and a plurality of output circuits coupled to the startup circuit, configured to precharge a third internal node based on the first potential of the first internal node, generate a plurality of output signals based on a scan clock signal or multiple clock signals, and determine whether to pull down the output signals based on the second potential of the second internal node.

Figure 1:
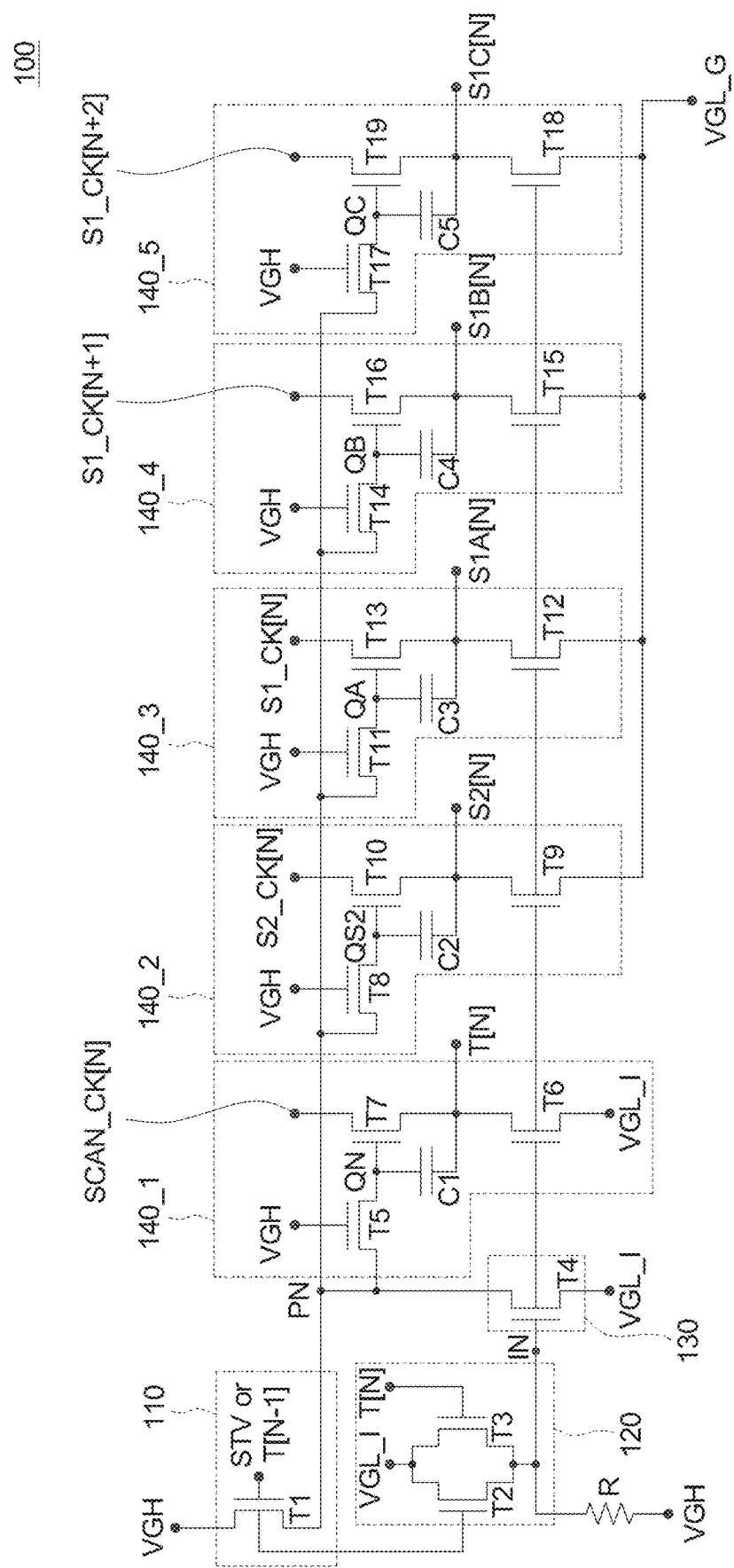
FIG. 1 illustrates a scan driver circuit according to an embodiment of the present application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 illustrates a scan driver circuit according to an embodiment of the present application. The scan driver circuit 100 according to the embodiment can be applied to, for example but not limited to, image display devices such as μLED display devices.

The scan driver circuit 100 according to the embodiment includes transistors T1 to T19, capacitors C1 to C5, and a resistor R. The scan driver circuit 100 according to this embodiment comprises: a start-up circuit 110, a NOR logic gate 120, a pull-down circuit 130, and multiple output circuits 140_1 to 140_5. Here, the scan driver circuit 100 is described with five output circuits 140_1 to 140_5 as an example, but it is understood that the case is not limited to this. The image display device includes multiple scan driver circuits, and the scan driver circuit 100 in FIG. 1 is the Nth-stage scan driver circuit of the image display device (N is a positive integer).

The start-up circuit 110 performs start-up control based on the start signal STV or the (N−1)th stage output signal T[N−1] (the (N−1)th stage output signal T[N−1] can be referred to as the previous stage output signal) to precharge a first internal node PN.

The NOR logic gate 120 is coupled to the start-up circuit 110 and performs logic control based on the start signal STV or the (N−1)th stage output signal T[N−1] and an Nth stage output signal T[N] to control the potential of a second internal node IN.

The pull-down circuit 130 is coupled to the start-up circuit 110 and is used to determine whether to pull down the potential of the first internal node PN based on the potential of the second internal node IN.

The output circuits 140_1 to 140_5 are coupled to the start-up circuit 110 and are used to precharge a third internal node QN based on the potential of the first internal node PN, generate multiple output signals based on a scan clock signal or multiple clock signals, and determine whether to pull down these output signals based on the potential of the second internal node IN.

The start-up circuit 110 includes the transistor T1. The transistor T1 includes a control terminal (e.g., but not limited to, the gate) that receives the start signal STV or the (N−1)th stage output signal T[N−1] (the (N−1)th stage output signal T[N−1] can be referred to as the previous stage output signal); a first terminal (e.g., but not limited to, the source) that receives a first reference voltage VGH (high potential); and a second terminal (e.g., but not limited to, the drain) that is coupled to the first internal node PN.

The NOR logic gate 120 includes the transistors T2 and T3. The transistor T2 includes a control terminal (e.g., but not limited to, the gate) that receives the start signal STV or the (N−1)th stage output signal T[N−1]; a first terminal (e.g., but not limited to, the source) that receives a second reference voltage VGL_I (low potential); and a second terminal (e.g., but not limited to, the drain) that is coupled to the second internal node IN. The transistor T3 includes a control terminal (e.g., but not limited to, the gate) that receives the Nth stage output signal T[N] (also referred to as the first output signal); a first terminal (e.g., but not limited to, the source) that receives the second reference voltage VGL_I (low potential); and a second terminal (e.g., but not limited to, the drain) that is coupled to the second internal node IN.

The pull-down circuit 130 includes the transistor T4. The transistor T4 includes a control terminal (e.g., but not limited to, the gate) that is coupled to the second internal node IN; a first terminal (e.g., but not limited to, the source) that is coupled to the first internal node PN; and a second terminal (e.g., but not limited to, the drain) that receives the second reference voltage VGL_I (low potential).

The output circuit 140_1 includes the transistors T5 to T7 and the capacitor C1. The transistor T5 includes a control terminal (e.g., but not limited to, the gate) that receives the first reference voltage VGH; a first terminal (e.g., but not limited to, the source) coupled to the first internal node PN; and a second terminal (e.g., but not limited to, the drain) coupled to the third internal node QN. The transistor T6 includes a control terminal (e.g., but not limited to, the gate) coupled to the second internal node IN; a first terminal (e.g., but not limited to, the source) coupled to the Nth stage output signal T[N]; and a second terminal (e.g., but not limited to, the drain) coupled to the second reference voltage VGL_I (low potential). The transistor T7 includes a control terminal (e.g., but not limited to, the gate) coupled to the third internal node QN; a first terminal (e.g., but not limited to, the source) that receives a scan clock signal SCAN_CK[N]; and a second terminal (e.g., but not limited to, the drain) that outputs the Nth stage output signal T[N]. The capacitor C1 is coupled between the third internal node QN and the Nth stage output signal T[N].

The output circuit 140_2 includes the transistors T8 to T10 and the capacitor C2. The transistor T8 includes a control terminal (e.g., but not limited to, the gate) that receives the first reference voltage VGH; a first terminal (e.g., but not limited to, the source) coupled to the first internal node PN; and a second terminal (e.g., but not limited to, the drain) coupled to a fourth internal node QS2. The transistor T9 includes a control terminal (e.g., but not limited to, the gate) coupled to the second internal node IN; a first terminal (e.g., but not limited to, the source) coupled to the output signal S2[N] (also referred to as the second output signal); and a second terminal (e.g., but not limited to, the drain) coupled to a third reference voltage VGL_G (low potential). The transistor T10 includes a control terminal (e.g., but not limited to, the gate) coupled to the fourth internal node QS2; a first terminal (e.g., but not limited to, the source) that receives a first clock signal S2_CK[N]; and a second terminal (e.g., but not limited to, the drain) that outputs the output signal S2[N]. The capacitor C2 is coupled between the fourth internal node QS2 and the output signal S2[N].

The output circuit 140_3 includes the transistors T11 to T13 and the capacitor C3. The transistor T11 includes a control terminal (e.g., but not limited to, the gate) that receives the first reference voltage VGH; a first terminal (e.g., but not limited to, the source) coupled to the first internal node PN; and a second terminal (e.g., but not limited to, the drain) coupled to a fifth internal node QA. The transistor T12 includes a control terminal (e.g., but not limited to, the gate) coupled to the second internal node IN; a first terminal (e.g., but not limited to, the source) coupled to the output signal S1A[N] (also referred to as the third output signal); and a second terminal (e.g., but not limited to, the drain) coupled to the third reference voltage VGL_G (low potential). The transistor T13 includes a control terminal (e.g., but not limited to, the gate) coupled to the fifth internal node QA; a first terminal (e.g., but not limited to, the source) that receives a second clock signal S1_CK[N]; and a second terminal (e.g., but not limited to, the drain) that outputs the output signal S1A[N]. The capacitor C3 is coupled between the fifth internal node QA and the output signal S1A[N].

The output circuit 140_4 includes the transistors T14 to T16 and the capacitor C4. The transistor T14 includes a control terminal (e.g., but not limited to, the gate) that receives the first reference voltage VGH; a first terminal (e.g., but not limited to, the source) coupled to the first internal node PN; and a second terminal (e.g., but not limited to, the drain) coupled to a sixth internal node QB. The transistor T15 includes a control terminal (e.g., but not limited to, the gate) coupled to the second internal node IN; a first terminal (e.g., but not limited to, the source) coupled to the output signal S1B[N] (also referred to as the fourth output signal); and a second terminal (e.g., but not limited to, the drain) coupled to the third reference voltage VGL_G (low potential). The transistor T16 includes a control terminal (e.g., but not limited to, the gate) coupled to the sixth internal node QB; a first terminal (e.g., but not limited to, the source) that receives a third clock signal S1_CK[N+1]; and a second terminal (e.g., but not limited to, the drain) that outputs the output signal S1B[N]. The capacitor C4 is coupled between the sixth internal node QB and the output signal S1B[N].

The output circuit 140_5 includes the transistors T17 to T19 and the capacitor C5. The transistor T17 includes a control terminal (e.g., but not limited to, the gate) that receives the first reference voltage VGH; a first terminal (e.g., but not limited to, the source) coupled to the first internal node PN; and a second terminal (e.g., but not limited to, the drain) coupled to a seventh internal node QC. The transistor T18 includes a control terminal (e.g., but not limited to, the gate) coupled to the second internal node IN; a first terminal (e.g., but not limited to, the source) coupled to the output signal S1C[N] (also referred to as the fifth output signal); and a second terminal (e.g., but not limited to, the drain) coupled to the third reference voltage VGL_G (low potential). The transistor T19 includes a control terminal (e.g., but not limited to, the gate) coupled to the seventh internal node QC; a first terminal (e.g., but not limited to, the source) that receives a fourth clock signal S1_CK[N+2]; and a second terminal (e.g., but not limited to, the drain) that outputs the output signal S1C[N]. The capacitor C5 is coupled between the seventh internal node QC and the output signal S1C[N].

The resistor R is coupled between the first reference voltage VGH and the second internal node IN.

Figure 2:
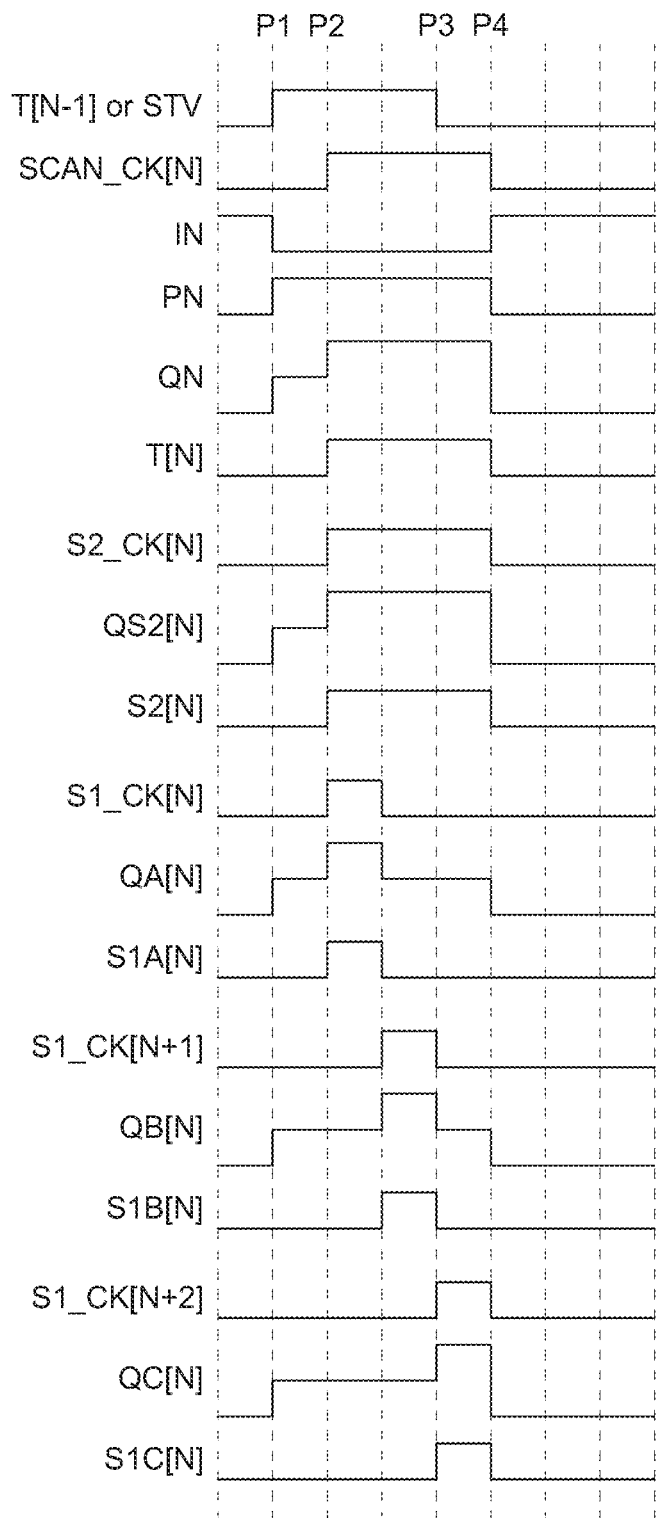
FIG. 2 shows the signal waveform diagram of the scan driving circuit according to an embodiment of the present application.

FIG. 2 shows the signal waveform diagram of the scan driving circuit according to an embodiment of the present application. Please refer to FIGS. 1 and 2. In the following description, since the circuit operations of output circuits 140_1 to 140_5 are similar, for simplification, the explanation will be based on output circuit 140_1. Those skilled in the art can infer the operations of output circuits 140_2 to 140_5 from this description.

At timing P1, the start signal STV or the (N-1)th stage output signal T[N-1] transits to a logic high to turn on the transistor T1, causing the first reference voltage VGH to precharge the first internal node PN through the transistor T1. Additionally, the first reference voltage VGH also turns on the transistor T5, enabling the first internal node PN to precharge the third internal node QN through the transistor T5, where PN=QN=VGH-VT, with VT representing the threshold voltage of the transistors T1 or T5. Furthermore, at timing P1, the start signal STV or the (N-1)th stage output signal T[N-1] transits to a logic high to turn on transistor T2, thereby causing the second reference voltage VGL_I to keep the transistors T4 and T6 turned off through the transistor T2. When the transistor T4 is turned off, the first internal node PN can essentially maintain its potential (i.e., it will not leak).

At timing P2, the scan clock signal SCAN_CK[N] transitions to a logic high, and through the coupling effect of transistor T7, the potential of the third internal node QN increases from (VGH-VT) to above the first reference potential VGH, turning on the transistor T7 and allowing the scan clock signal SCAN_CK[N] to be output to the output signal T[N]. Additionally, as shown in FIG. 2, the start signal STV (or the (N-1)th stage output signal T[N-1]) and the scan clock signal SCAN_CK[N] are offset by the time of one pixel line.

Therefore, when the scan clock signal SCAN_CK[N] can be output to the output signal T[N], making the output signal T[N] logic high, the transistor T3 is turned on. The second internal node IN remains at the potential of the second reference voltage VGL_I, thus keeping the transistor T6 turned off, and as a result, the output signal T[N] is maintained.

At timing P3, the start signal STV or the (N-1)th stage output signal T[N-1] transits to logic low, turning off the transistors T1 and T2.

At timing P4, the scan clock signal SCAN_CK[N] transits to logic low, causing the transistor T3 to turn off and the transistor T2 to remain off. Therefore, the first reference voltage VGH can enter the second internal node IN through the resistor R, turning on the transistors T4 and T6, which pulls the output signal T[N] low. The first internal node PN will also be pulled low, thus resetting the entire circuit. The next time the start signal STV or the (N-1)th stage output signal T[N-1] transits to logic high, the cycle will repeat.

Similarly, for output circuits 140_2 to 140_5, when the start signal STV or the (N-1)th stage output signal T[N-1] transits to logic high, the fourth to seventh internal nodes QS2, QA, QB, and QC will be precharged to VGH-VT.

As shown in FIG. 2, the logic high period of the clock signals S1_CK[N] to S1_CK[N+2] is relatively short, while the logic high period of the clock signal S2_CK[N] and the scan clock signal SCAN_CK[N] is relatively long. In one embodiment of the present application, the logic high period of the clock signals S1_CK[N] to S1_CK[N+2] is covered by the logic high period of the clock signal S2_CK[N] and the scan clock signal SCAN_CK[N]. Therefore, when the clock signals S1_CK[N] to S1_CK[N+2] and S2_CK[N] transition to logic high, output circuits 140_2 to 140_5 can generate the output signals S2[N], S1A[N], S1B[N], and S1C[N].

Similarly, when the scan clock signal SCAN_CK[N] transitions to logic low, it will pull the second internal node IN low, which will pull the output signals S2[N], S1A[N], S1B[N], and S1C[N] low.

Figure 3:
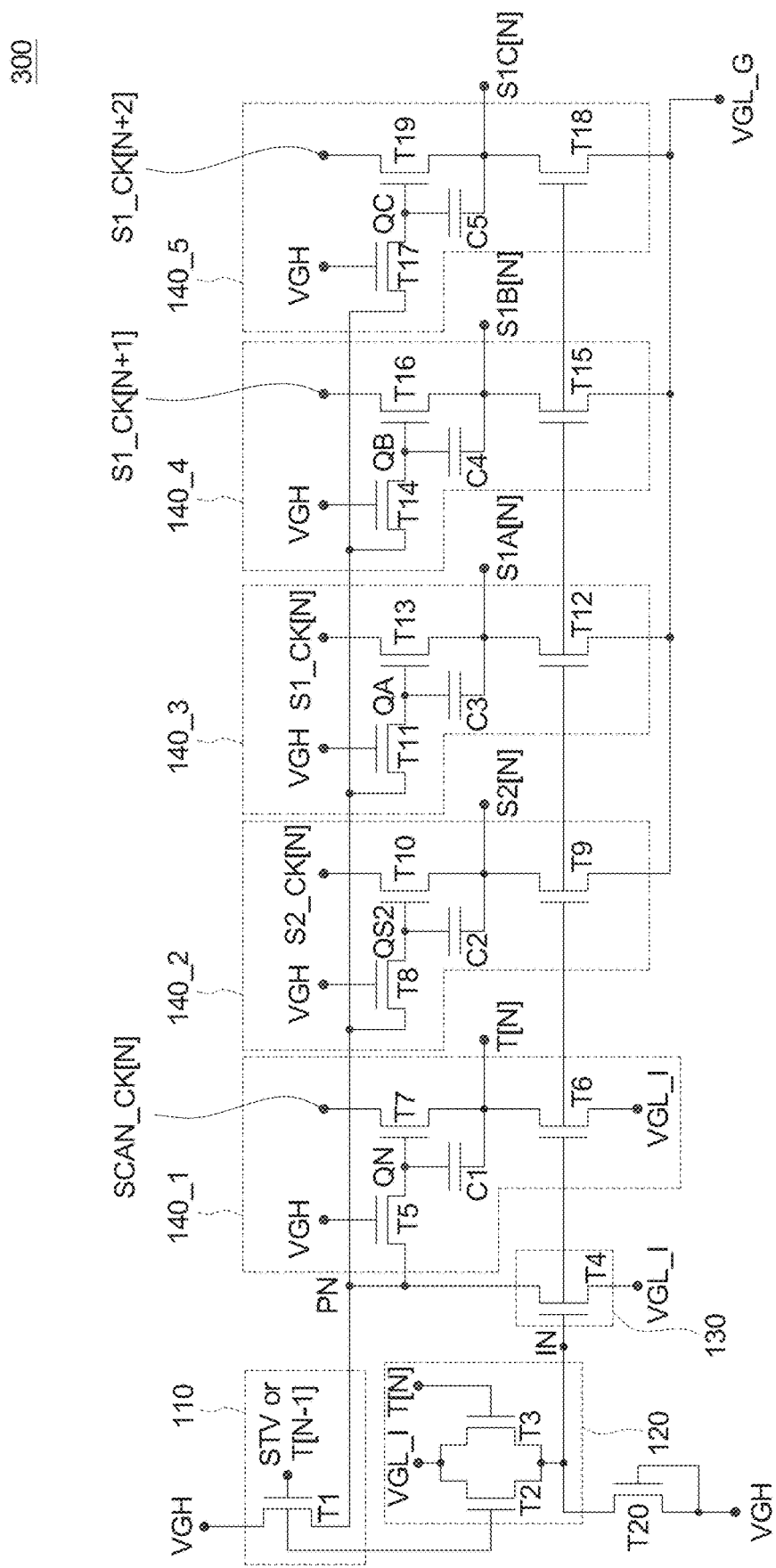
FIG. 3 shows a scan driving circuit according to an embodiment of the present application.

FIG. 3 shows a scan driving circuit according to an embodiment of the present application. The scan driving circuit 300 according to one embodiment of the present application includes transistors T1 to T19, capacitors C1 to C5, and transistor T20. The transistor T20, configured as a diode, is used to replace the resistor R, thereby further saving circuit area.

Figure 4:
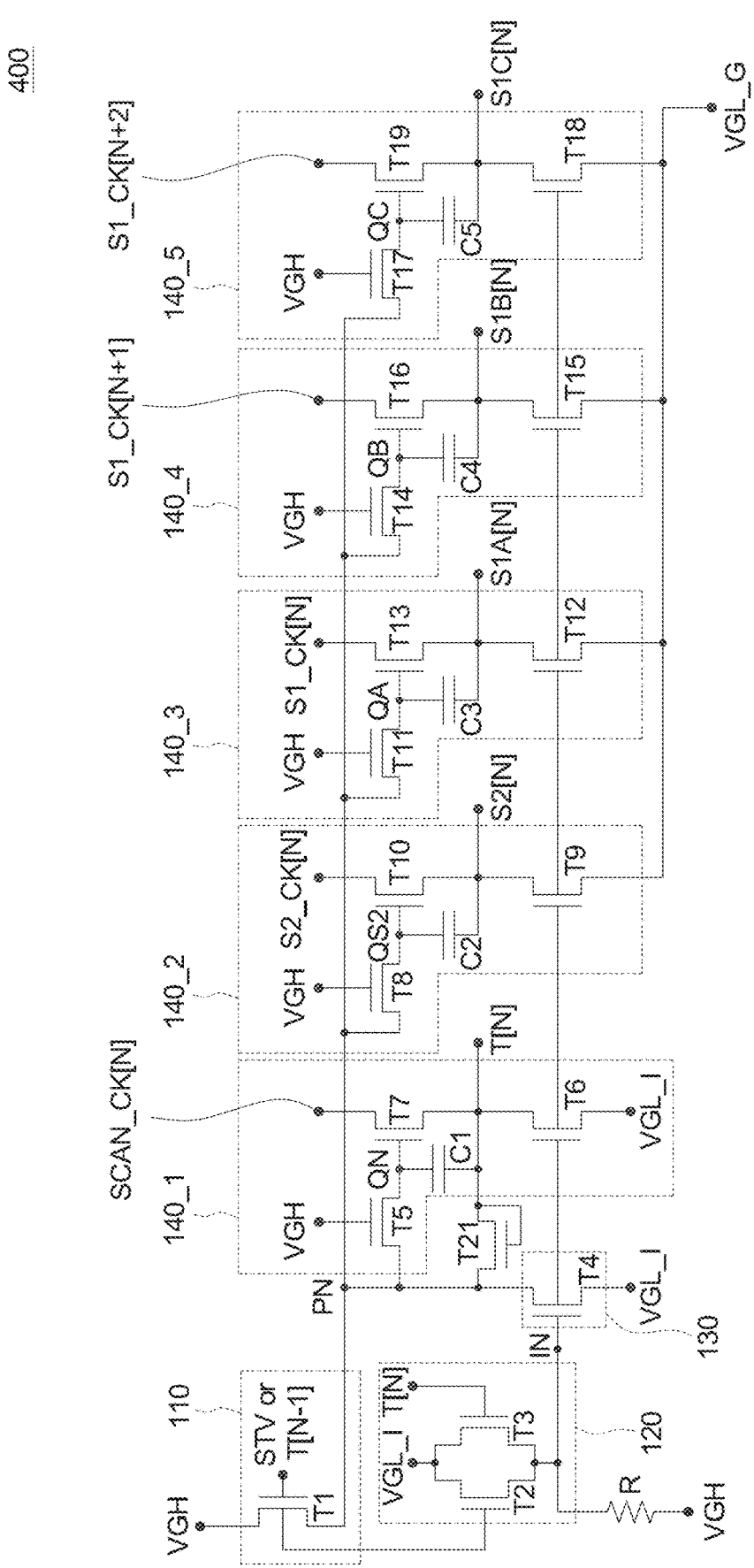
FIG. 4 shows a scan driving circuit according to an embodiment of the present application.

FIG. 4 shows a scan driving circuit according to an embodiment of the present application. The scan driving circuit 400 according to one embodiment of the present application includes transistors T1 to T19, capacitors C1 to C5, resistor R, and transistor T21. The transistor T21, configured as a diode, is coupled between the first internal node PN and the Nth output signal T[N]. In the event of a slight leakage in transistor T4, the first internal node PN will gradually leak. Therefore, by introducing the transistor T21, the Nth output signal T[N] can be pulled up to the first internal node PN through transistor T21, preventing the potential of the first internal node PN from dropping and delaying its leakage.

Figure 5:
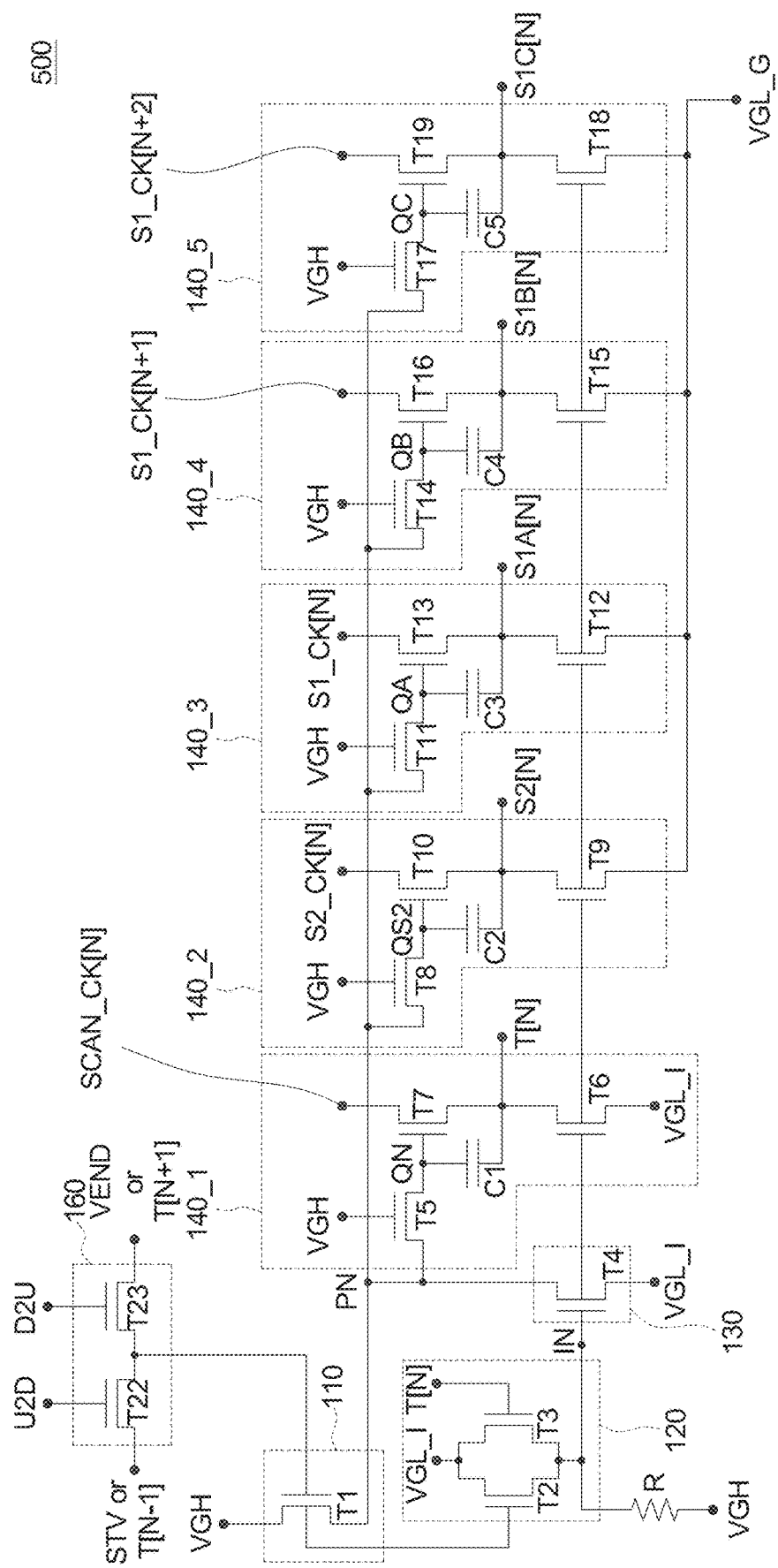
FIG. 5 shows a scan driving circuit according to an embodiment of the present application.

FIG. 5 shows a scan driving circuit according to an embodiment of the present application. The scan driving circuit 500 according to one embodiment of the present application includes transistors T1 to T19, capacitors C1 to C5, resistor R, and transistors T22 to T23. The scan driving circuit 500 has a bidirectional scanning function. Transistors T22 and T23 form the bidirectional scan control circuit 160. In FIG. 5, the control terminal of transistor T1 is connected to the coupling point of transistors T22 and T23. The transistor T22 includes: a control terminal (e.g., gate) that receives a first direction control signal U2D; a first terminal (e.g., source) that receives the start signal STV or the (N−1)th output signal T[N−1]; and a second terminal (e.g., drain) coupled to the control terminal of the first transistor T1. The transistor T23 includes: a control terminal (e.g., gate) that receives a second direction control signal D2U; a first terminal (e.g., source) that receives an end voltage VEND or the (N+1)th output signal T[N+1]; and a second terminal (e.g., drain) coupled to the control terminal of the first transistor T1. When the first direction control signal U2D is enabled, the scan driving circuit 500 can perform top-to-bottom scanning; and when the second direction control signal D2U is enabled, the scan driving circuit 500 can perform bottom-to-top scanning.

The operational principles of the scan driving circuits 300, 400, and 500 in FIGS. 3 to 5 are essentially the same or similar to those in FIG. 1, so the details are omitted here.

The scan driving circuits in FIGS. 3 to 5 can be combined in any way, which is also within the scope of the present application. In one possible embodiment of the present application, the scan driving circuit includes transistors T1 to T19, capacitors C1 to C5, and transistors T20 and T21 (combining the embodiments of FIGS. 3 and 4). The rest can be inferred accordingly.

From the above embodiments, it can be seen that by slightly increasing the number of clock signals, the frame rate support flexibility in the scan driving circuit can be enhanced. For example, by adding two clock signals S2_CK[5] to S2_CK[6], allowing overlap between S2_CK signals (e.g., between S2_CK[1] and S2_CK[4]), greater design flexibility is provided. Thus, the waveform width of the clock signals S2_CK[1] to S2_CK[6] can be increased, offering more design space. Additionally, the signal width upper limit of the output signals S1A[N], S1B[N], and S1C[N] can also be correspondingly increased, supporting the circuit's charging at higher frame rates.

In the above embodiments, the bidirectional scanning circuit (such as in FIGS. 1, 3, and 4) can be removed, and the pull-back related functional circuits can be modified. The circuit can operate normally and meet all performance and functional requirements. Moreover, removing the bidirectional scanning circuit can reduce the total number of TFTs, simplifying circuit design and reducing the layout space needed due to fewer TFTs. This can result in a smaller circuit board or provide more space for other components or functions.

Therefore, in one embodiment, optimizing the circuit design, particularly when bidirectional scanning functionality is not required, can simplify and make the circuit more efficient, potentially reducing costs and space requirements.

Additionally, the above embodiments offer optimization strategies in circuit design to significantly reduce the number of required pins. Reducing the number of pins can lower manufacturing costs, reduce circuit complexity, and possibly improve overall signal quality. For example, pins related to the bidirectional scanning function (e.g., U2D, D2U, VEND) can be removed, and the number of start signals STV and clock signals can also be reduced. Thus, in the above embodiments, optimizing circuit design, particularly by reducing the required number of pins, can provide multiple benefits, including cost reduction, simplified design, and enhanced performance.

Furthermore, the above embodiments disclose an optimized design for signal transmission. Simplifying the signal transmission can save circuit layout space, allowing for a smaller circuit board or more space for other components or functions. Additionally, a simplified layout means a simpler manufacturing process and lower manufacturing costs. This optimization can provide multiple benefits, including cost reduction, simplified design, and improved performance.

Although the present application may describe many specific details, these should not be construed as limiting the scope of the claimed invention, but rather as describing features of specific embodiments. Certain features described in the context of a single embodiment can also be implemented in combination in a single embodiment. Conversely, various features described in the context of a single embodiment can be implemented individually or in any suitable sub-combination in multiple embodiments. Additionally, although certain features may be initially described as operating in certain combinations, and even though such combinations may be initially claimed as such, in some cases, one or more features may be removed from a combination, and the described combination may function with a sub-combination or variation of a sub-combination. Similarly, although operations are depicted in the illustrations as occurring in a specific order, this should not be understood as requiring such operations to be performed in the shown specific order or sequentially, or that all illustrated operations must be performed to achieve the desired results.

Although the above embodiments of the present application disclose only some examples and implementations, based on the disclosed content, changes, modifications, and enhancements to the described examples and implementations, as well as other implementations, can be made.

What is claimed is:

1. A scan driving circuit comprising:
    a startup circuit configured to perform startup control based on a startup signal or a preceding stage output signal to precharge a first internal node;
    a logic gate coupled to the startup circuit, configured to perform logic control based on the startup signal or the preceding stage output signal and a first output signal to control a second potential of a second internal node;
    a pull-down circuit coupled to the startup circuit, configured to determine whether to pull down a first potential of the first internal node based on the second potential of the second internal node; and
    a plurality of output circuits coupled to the startup circuit, configured to precharge a third internal node based on the first potential of the first internal node, generate a plurality of output signals based on a scan clock signal or multiple clock signals, and determine whether to pull down the output signals based on the second potential of the second internal node,
    wherein
    the startup circuit includes a first transistor,
        the first transistor comprising: a control terminal receiving the startup signal or the preceding stage output signal, a first terminal receiving a first reference voltage, and a second terminal coupled to the first internal node; and
    the logic gate includes a second and a third transistor,
        the second transistor comprising a control terminal receiving the startup signal or the preceding stage output signal, a first terminal receiving a second reference voltage, and a second terminal coupled to the second internal node; and the third transistor comprising: a control terminal receiving a first output signal of the output signals, a first terminal receiving the second reference voltage, and a second terminal coupled to the second internal node.

2. The scan driving circuit as claimed in claim 1, wherein:

the pull-down circuit includes a fourth transistor, the fourth transistor comprising: a control terminal coupled to the second internal node, a first terminal coupled to the first internal node, and a second terminal receiving the second reference voltage;

a first output circuit of the output circuits includes a fifth to a seventh transistor and a first capacitor, the fifth transistor comprising: a control terminal receiving the first reference voltage, a first terminal coupled to the first internal node, and a second terminal coupled to the third internal node;

the sixth transistor comprising: a control terminal coupled to the second internal node, a first terminal coupled to the first output signal, and a second terminal coupled to the second reference voltage;

the seventh transistor comprising a control terminal coupled to the third internal node, a first terminal receiving the scan clock signal, and a second terminal outputting the first output signal;

the first capacitor coupled between the third internal node and the first output signal;

a second output circuit of the output circuits includes an eighth to a tenth transistor and a second capacitor, the eighth transistor comprising: a control terminal receiving the first reference voltage, a first terminal coupled to the first internal node, and a second terminal coupled to a fourth internal node;

the ninth transistor comprising: a control terminal coupled to the second internal node, a first terminal coupled to a second output signal of the output signals, and a second terminal coupled to a third reference voltage;

the tenth transistor comprising: a control terminal coupled to the fourth internal node, a first terminal receiving a first clock signal of the clock signals, and a second terminal outputting the second output signal;

the second capacitor coupled between the fourth internal node and the second output signal;

a third output circuit of the output circuits includes an eleventh to a thirteenth transistor and a third capacitor, the eleventh transistor comprising: a control terminal receiving the first reference voltage, a first terminal coupled to the first internal node, and a second terminal coupled to a fifth internal node;

the twelfth transistor comprising: a control terminal coupled to the second internal node, a first terminal coupled to a third output signal, and a second terminal coupled to the third reference voltage;

the thirteenth transistor comprising: a control terminal coupled to the fifth internal node, a first terminal receiving a second clock signal of the clock signals, and a second terminal outputting the third output signal;

the third capacitor coupled between the fifth internal node and the third output signal;

a fourth output circuit of the output circuits includes a fourteenth to a sixteenth transistor and a fourth capacitor, the fourteenth transistor comprising: a control terminal receiving the first reference voltage, a first terminal coupled to the first internal node, and a second terminal coupled to a sixth internal node;

the fifteenth transistor comprising: a control terminal coupled to the second internal node, a first terminal coupled to a fourth output signal of the output signals, and a second terminal coupled to the third reference voltage;

the sixteenth transistor comprising: a control terminal coupled to the sixth internal node, a first terminal receiving a third clock signal of the clock signals, and a second terminal outputting the fourth output signal;

the fourth capacitor coupled between the sixth internal node and the fourth output signal;

a fifth output circuit of the output circuits includes a seventeenth to a nineteenth transistor and a fifth capacitor, the seventeenth transistor comprising: a control terminal receiving the first reference voltage, a first terminal coupled to the first internal node, and a second terminal coupled to a seventh internal node;

the eighteenth transistor comprising: a control terminal coupled to the second internal node, a first terminal coupled to a fifth output signal of the output signals, and a second terminal coupled to the third reference voltage;

the nineteenth transistor comprising: a control terminal coupled to the seventh internal node, a first terminal receiving a fourth clock signal of the clock signals, and a second terminal outputting the fifth output signal;

the fifth capacitor coupled between the seventh internal node and the fifth output signal; and the scan driving circuit further includes a resistor coupled between the first reference voltage and the second internal node.

3. The scan driving circuit as claimed in claim 2, wherein:

at a first timing, the startup signal or the preceding stage output signal turns on the first and second transistors, causing the first reference voltage to precharge the first internal node through the first transistor, the first reference voltage turns on the fifth transistor, causing the first internal node to precharge the third internal node through the fifth transistor, the second reference voltage turns off the fourth and sixth transistors through the second transistor, and the fourth transistor is turned off to maintain the first potential of the first internal node;

at a second timing, the scan clock signal transitions to increase the third potential of the third internal node, turning on the seventh transistor, causing the scan clock signal to output to the first output signal, the first output signal turns on the third transistor and turns off the sixth transistor to maintain the first output signal;

at a third timing, the startup signal or the preceding stage output signal turns off the first and second transistors;

at a fourth timing, the scan clock signal transitions, and the second and third transistors are turned off, allowing the first reference voltage to enter the second internal node through the resistor, turning on the fourth and sixth transistors, pulling down the first output signal and the first internal node;

when the startup signal or the preceding stage output signal transitions, precharging the fourth to seventh internal nodes;

when the first to fourth clock signals transition to a logic high, the second to fifth output circuits generate the second to fifth output signals; and when the scan clock signal transitions to a logic low, pulling down the second internal node to pull down the second to fifth output signals.

4. The scan driving circuit as claimed in claim 3, wherein the resistor is implemented using a twentieth transistor connected as a diode.

5. The scan driving circuit as claimed in claim 3, further comprising a twenty-first transistor connected as a diode, the twenty-first transistor coupled between the first internal node and the first output signal, to pull the first output signal back to the first internal node through the twenty-first transistor.

6. The scan driving circuit as claimed in claim 3, further comprising a twenty-second and a twenty-third transistor, forming a bidirectional scan control circuit,
- wherein the control terminal of the first transistor is coupled to a coupling point of the twenty-second and twenty-third transistors,
- the twenty-second transistor comprising: a control terminal receiving a first direction control signal, a first terminal receiving the startup signal or the preceding stage output signal, and a second terminal coupled to the control terminal of the first transistor;
- the twenty-third transistor comprising: a control terminal receiving a second direction control signal, a first terminal receiving an end voltage or a subsequent stage output signal, and a second terminal coupled to the control terminal of the first transistor.

* * * * *